(12) United States Patent
Park

(10) Patent No.: US 6,316,306 B1
(45) Date of Patent: Nov. 13, 2001

(54) MEMORY CELL ARRAY IN A DYNAMIC RANDOM ACCESS MEMORY AND METHOD FOR FABRICATING THE SAME

(75) Inventor: Syung-Hyun Park, Seoul (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/544,548

(22) Filed: Apr. 6, 2000

(30) Foreign Application Priority Data

Apr. 15, 1999 (KR) .................................. 11/13368

(51) Int. Cl.$^7$ ............................................. H01L 21/8242
(52) U.S. Cl. ............................................. 438/239; 438/381
(58) Field of Search .................................. 438/238, 239, 438/250, 253, 393, 396, 637, 638, 639, 640, 648, 381

(56) References Cited

U.S. PATENT DOCUMENTS

| | | | |
|---|---|---|---|
| 5,838,036 | * 11/1998 | Mori | 257/296 |
| 5,933,724 | * 8/1999 | Sekiguchi et al. | 438/239 |
| 6,087,212 | * 7/2000 | Hirota | 438/238 |
| 6,127,734 | * 10/2000 | Kimura | 257/774 |

* cited by examiner

*Primary Examiner*—David Nelms
*Assistant Examiner*—David Nhu
(74) *Attorney, Agent, or Firm*—Morgan, Lewis & Bockius LLP

(57) ABSTRACT

A memory cell array structure of a DRAM is disclosed. The disclosed memory cell array includes at least one active region surrounded with an element isolating insulation layer in a semiconductor substrate. The memory cell array includes two conductive layers, each being at least partly disposed in the active region. A gate insulation layer is on the semiconductor substrate in the active region. A plurality of word lines are on the gate insulation layer and disposed between the two conductive layers in the active region and on the element isolating insulation layer. The word lines have a spacing $\lambda_1$ therebetween on the element isolating insulation layer and a spacing $\lambda_2$ therebetween in the active region. Also, the word lines are arranged in a first direction without overlapping with each other. The memory cell array also includes spacers formed on peripheries of the word lines, and source and drain regions in the semiconductor substrate between the word lines in the active region. The drain regions are connected to the conductive layers. The spacing $\lambda_1$ is different from the spacing $\lambda_2$.

6 Claims, 22 Drawing Sheets

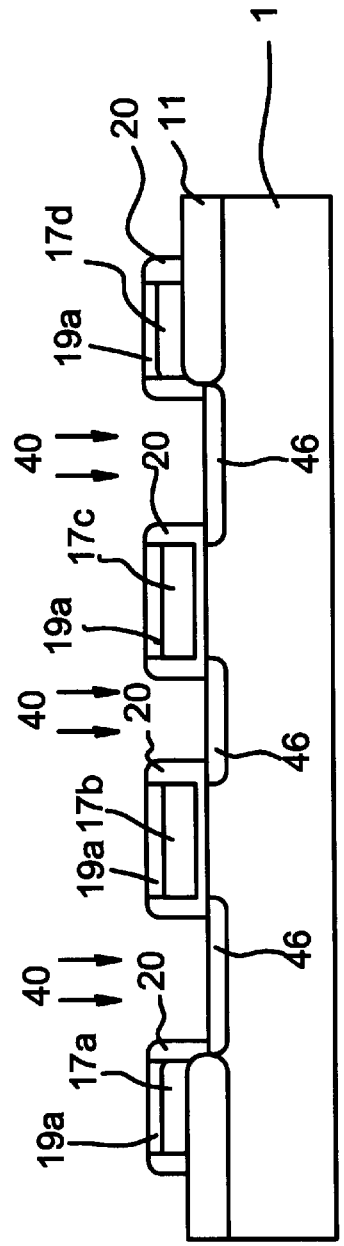
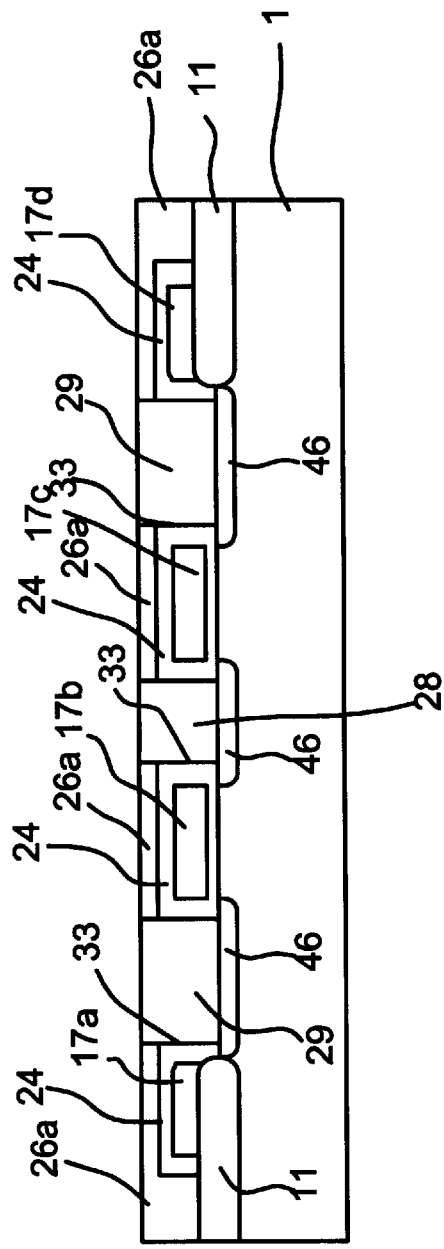

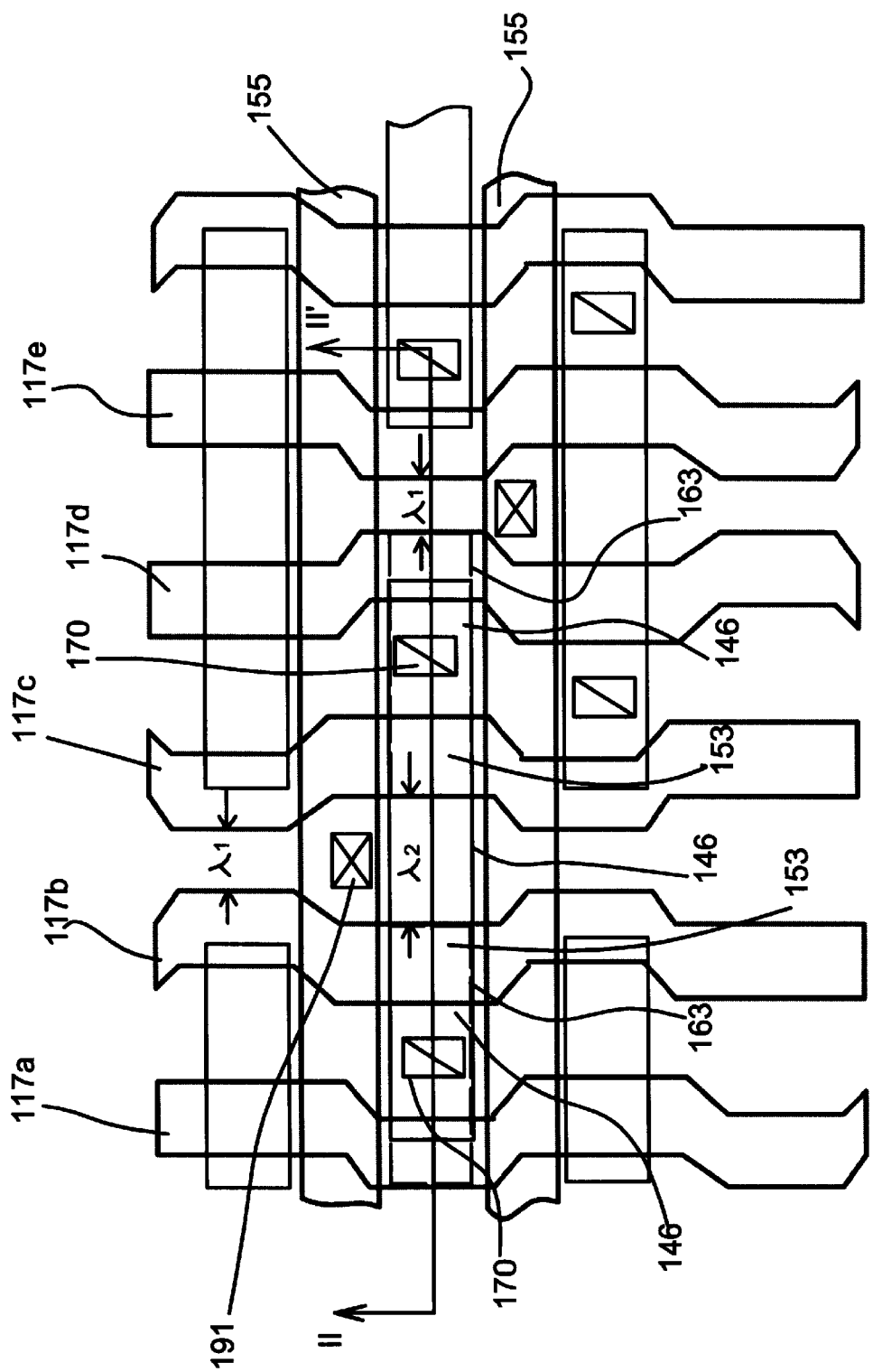

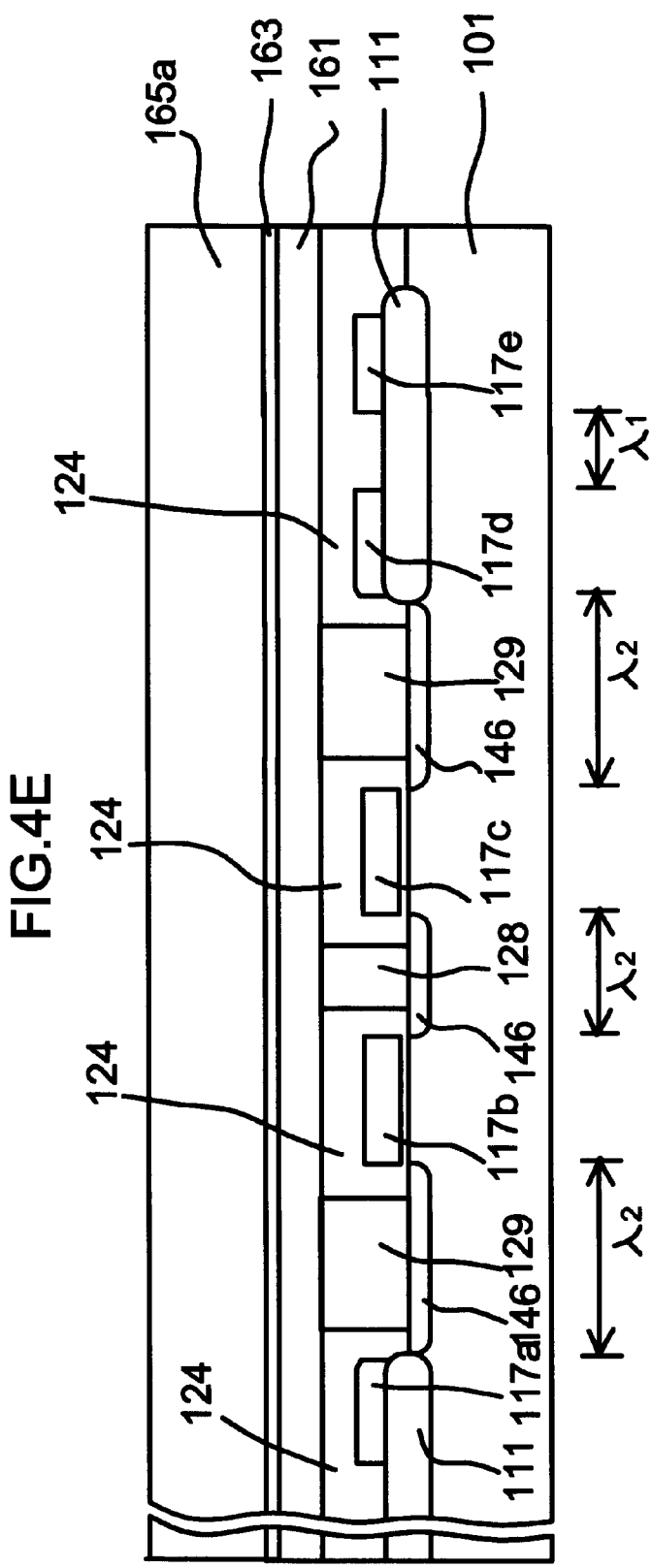

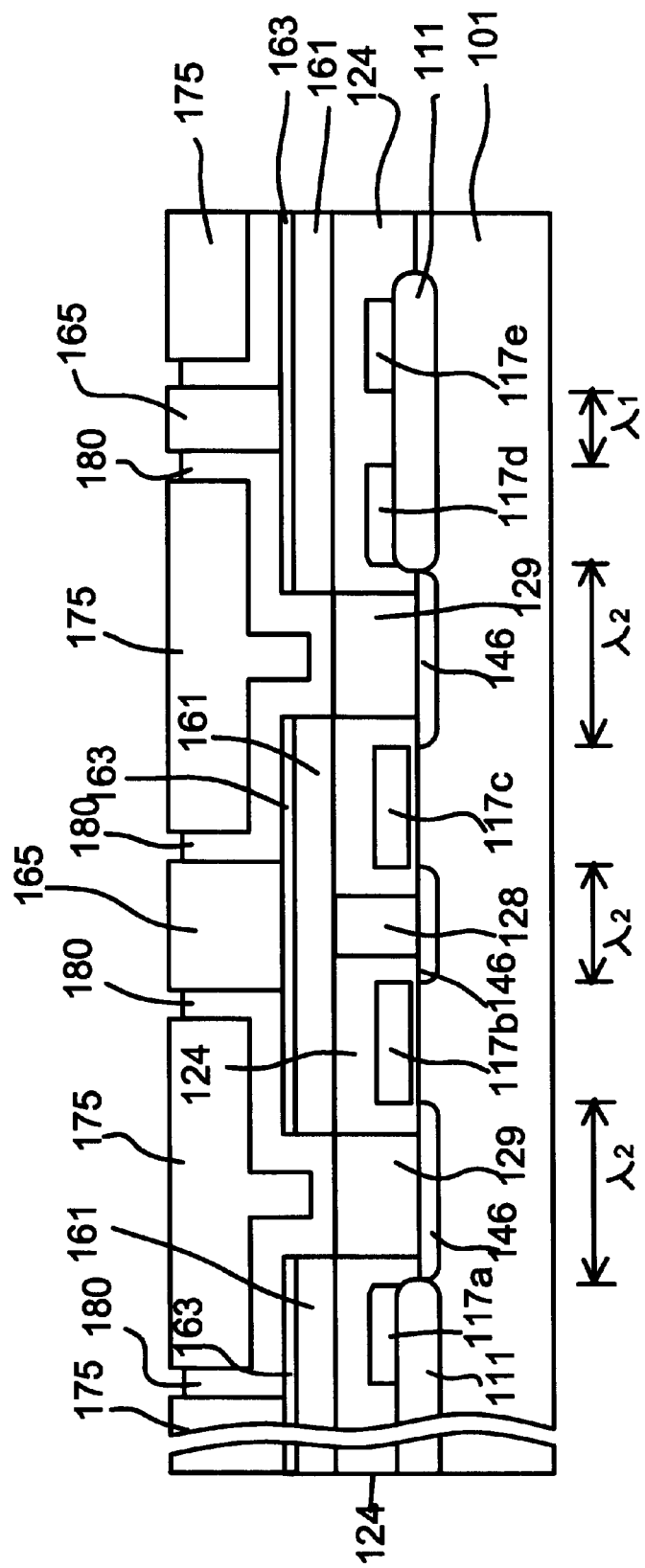

MEMORY CELL ARRAY IN A DYNAMIC RANDOM ACCESS MEMORY AND METHOD FOR FABRICATING THE SAME

This application claims the benefit of Application No. 99-13368, filed in Korea on Apr. 15, 1999, which is hereby incorporated by reference.

BACKGROUND OF THE INVENTION

1. Field of the Invention

The present invention relates to a method for fabricating a dynamic random access memory (DRAM) and, more particularly, to a dynamic random access memory (DRAM) containing a capacitor on bit line (COB) type memory cells and its fabrication method.

2. Discussion of the Related Art

A metal-oxide-semiconductor (MOS) type DRAM has a memory cell comprising one MOS transistor and one capacitor connected thereto. As developments have been made in DRAM device technique to achieve high integration and high speed response, a size of each capacitor has been reduced, resulting in the amount of charge stored in the capacitor being decreased. The decrease in the amount of charge results in soft errors that may alter the content of the memory cell. To overcome this problem, a method for increasing the occupied area of each capacitor has been proposed, in which storage nodes composed of polycrystalline silicon are formed in a semiconductor substrate in order to increase capacitance of the capacitor.

FIG. 1 is a plan view of a memory cell array of a DRAM according to a related art. As shown in FIG. 1, on the surface of a semiconductor substrate 1 are formed a plurality of word lines 17a, 17b, 17c and 17d which run parallel with one another in rows. Also formed on the substrate are a plurality of bit lines 55 which run parallel with one another in columns. A plurality of memory cells (MC) are arranged at the respective intersections of the word lines and the bit lines. Each memory cell comprises one transfer gate transistor 53 and one capacitor 64. The transfer gate transistor 53 comprises a pair of source/drain regions 46 formed in the surface of the semiconductor substrate 1, and a gate electrode (word line) 17b or 17c formed between the source/drain regions 46. A thick insulation layer is formed on the gate electrodes 17b and 17c. Subsequently, contact holes 28 and 29 are formed in a predetermined portion of the insulation layer so as to expose the source/drain regions 46 of the transfer gate transistor 53.

The reference numeral 29 denotes capacitor node contact portions, and the reference numeral 28 denotes a bit line contact portion. The contact holes 28 and 29 formed by photolithography and the etching method are gap-filled with the plug of a conductive layer such as a doped polycrystalline silicon layer. A bit line contact hole 91 is located over an element isolating insulation layer. In the memory cell array, the word lines have a predetermined width and arranged in parallel with a predetermined spacing from one another.

Now, manufacturing steps of the DRAM memory cell shown in FIG. 1 will be described with reference to sectional views of FIGS. 2A to 2L, which are views along line I–I' of FIG. 1.

As shown in FIG. 2A, an element isolating insulation layer 11 and a channel stopper region (not shown) are formed in predetermined regions on the main surface of a P-type semiconductor substrate 1. A gate insulation layer 15, a polycrystalline silicon layer 17 and an interlayer insulation layer 19a are sequentially formed on the surface of the semiconductor substrate 1.

The element isolating insulation layer 11 may be formed by a selective oxidation method such as a LOCOS (Local Oxidation of Silicon) method or other methods including STI (Shallow Trench Isolation). The gate insulation layer 15 is formed by the thermal oxidation method. The polycrystalline silicon layer 17 and the interlayer insulation layer 19a are each deposited to a thickness of 1000–2000 Å by the CVD method.

As shown in FIG. 2B, word lines 17a, 17b, 17c and 17d are formed by photolithography and the etching method. The interlayer insulation layer 19a of the patterned oxide film is left on the surface of the word lines 17a–17d.

As shown in FIG. 2C, an insulation layer is formed on the whole surface of the semiconductor substrate 1 by the CVD method and etched by an anisotropical reactive ion etching (RIE) to form sidewall spacers 20 on the peripheries of the word lines 17a–17d. Impurity ions 40 such as arsenic are implanted under an implantation energy 30 KeV at a dose of $4.0 \times 10^{15}/cm^2$ in the surface of the silicon substrate 1 by using the word lines 17a–17d covered with the insulation layer 19a and the spacers 20 as masks to form the source and drain regions 46 of the transfer gate transistor.

As shown in FIG. 2D, the surface of the semiconductor substrate 1 is planarized with an interlayer insulation layer 26a, e.g., a BPSG (Borophosphrousilicate Glass) film. Contact holes 33 are formed in the bit line contact portion 28 and the capacitor node contact portion 29 by photolithography and the etching method, which is followed by deposition of doped polycrystalline silicon. Then, polysilicon plugs 28 and 29 are formed in the contact holes by an etch-back method.

The plugs may be formed not only by the etch-back technique using the RIE but also by other methods including CMP (Chemical Mechanical Polishing). The interlayer insulation layer 19a on the word lines and the sidewall spacer 20 on the peripheries of the word lines are integrally called an interlayer insulation layer 24.

As shown in FIG. 2E, an insulation layer 61 is deposited on the whole surface of the semiconductor substrate 1, isolating the plugs 28 and 29. Contact holes (not shown) are formed over the bit line contact portion 28. A conductive layer, such as a doped polycrystalline silicon layer, a metal layer, or a metal silicide layer, are formed on the surface of the semiconductor substrate 1, which are patterned by photolithography and the etching method. As a result, the bit lines (not shown) are formed.

Subsequently, an etching stopping layer 63, such as a nitride ($Si_3N_4$) film having a thickness of more than 100 Å, is formed. Then, a silicon oxide ($SiO_2$) film 65a having a thickness of more than 5000 Å is formed on the surface of the nitride film 63.

The bit lines are disposed above the element isolating insulation layer of the memory cell array and in the direction perpendicular to the word lines. The bit lines are also arranged in parallel with the active regions of the memory cell, each having two transfer gate transistors as MOS transistors. The interlayer insulation layers 24 and 26a are integrally called an interlayer insulation layer 27.

As shown in FIG. 2F, a capacitor isolating layer 65 for isolating the adjacent capacitors is formed by patterning the oxide film 65a by the etching method. The selective etching ratio of the nitride film 63, which is an etching stopping layer, to the oxide film 65a is extremely high. Therefore, in this etching step, the nitride film 63 is etched at a much slower rate than the oxide film 65*a*.

As shown in FIG. 2G, contact holes 70 are formed so as to reach the plug of the capacitor node contact portion 29 on the source and drain regions 46 by photolithography and the etching method.

As shown in FIG. 2H, a polycrystalline silicon layer 72 having a thickness of 500–1500 Å is deposited on an inner surface of the contact hole 70, on the surface of the nitride film 63, and on the surface of the capacitor isolating layer 65 by the CVD method. Then, a thick resist 75 is applied over a surface of the polycrystalline silicon layer 72.

As shown in FIG. 2I, the resist 75 is etched back to expose a part of the polycrystalline silicon layer 72.

As shown in FIG. 2J, the exposed surface of the polycrystalline silicon layer 72 is selectively removed by anisotropic etch or the like. As a result, the polycrystalline silicon layer 72 is isolated on the surface of the capacitor isolating layer 65 to form a lower electrode 80 of the capacitor.

As shown in FIG. 2K, the resist 75 is removed by the etching method, and the capacitor isolating layer 65 is removed by a plasma etching method. Then, a dielectric layer 84, such as a nitride film, is formed on the surface of the lower electrode 80.

As shown in FIG. 2L, an upper electrode 85 is formed of a polycrystalline silicon layer having a thickness of 2000–3000 Å on the surface of the dielectric layer 84 by the CVD method. Thereafter, an insulation layer 88 and an interconnection layer 90 are formed to complete the manufacturing steps of the memory cell of the DRAM.

In the memory cell of the DRAM according to the related art, the plugs used as the capacitor and bit line contacts are formed in the source and drain regions of the transfer gate transistor by photolithography and the etching method after the word lines are formed. These patterns are arranged linearly between the transfer gates, thereby requiring the transfer gates to be spaced farther apart than is otherwise desired to provide ample room between transfer gates for making desired contacts to active areas. Such increase in transfer gate pitch works against the integration of the memory cell. In addition, during deposition of an insulation layer for isolating the word lines after the spacer is formed on the peripheries of the word lines, key holes may be formed inside the insulation layer and adversely affect the subsequent manufacturing process steps.

SUMMARY OF THE INVENTION

Accordingly, the present invention is directed to a method for fabricating dynamic random access memory that substantially obviates one or more of the problems due to limitations and disadvantages of the related art.

Accordingly, an object of the present invention is to provide a method for fabricating a DRAM having a large dimensional allowance in patterning.

Another object of the present invention is to provide a cell structure of a DRAM cell having a large dimensional allowance in patterning.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a memory cell array structure of a DRAM includes: at least one active region surrounded with an element isolating insulation layer in a semiconductor substrate; two conductive layers, each being at least partly disposed in the active region; a gate insulation layer on the semiconductor substrate in the active region; a plurality of word lines on the gate insulation layer and disposed between the two conductive layers in the active region and on the element isolating insulation layer, the word lines having a spacing $\lambda_1$ therebetween on the element isolating insulation layer and a spacing $\lambda_2$ therebetween in the active region, the word lines being arranged in a first direction without overlapping with each other; spacers formed on peripheries of the word lines; and source and drain regions in the semiconductor substrate between the word lines in the active region, the drain regions being connected to the conductive layers, wherein the spacing $\lambda_1$ is different from the spacing $\lambda_2$.

In another aspect of the present invention, a memory cell array structure of a DRAM includes: at least one active region surrounded with an element isolating insulation layer in a semiconductor substrate; two first conductive layers, each being at least partly disposed in the active region; a gate insulation layer on the semiconductor substrate in the active region; a plurality of word lines on the gate insulation layer and disposed between the two first conductive layers in the active region and on the element isolating insulation layer, the word lines having a spacing $\lambda_1$ therebetween in the element isolating insulation layer and a spacing $\lambda_2$ therebetween in the active region, the word lines being arranged in a first direction without overlapping with each other; spacers formed on peripheries of the word lines; and source and drain regions in the semiconductor substrate between the word lines in the active region; self-aligned second conductive layers on the source and drain regions in the active region, two of the second conductive layers each connecting one of the first conductive layers to a drain region in the active region, wherein the spacing $\lambda_1$ is different from the spacing $\lambda_2$.

In yet another aspect of the present invention, a memory cell array structure of a DRAM includes: a substrate; a plurality of bit lines arranged in columns on the substrate; a plurality of word lines arranged in rows on the substrate; a plurality of memory cells each comprising a cell transistor and a cell capacitor on the substrate, each pair of the cell transistors sharing a source region; bit line contacts, each connecting the source region to one of the bit lines; drain plugs formed in a self-aligned manner for each connecting a drain region of one of the cell transistors to an electrode of a respective cell capacitor, wherein drain, channel and source regions of the cell transistors are aligned in a direction of the bit lines.

In a further aspect of the present invention, a method for fabricating a DRAM includes the steps of: forming an active region surrounded with an element isolating insulation layer in a semiconductor substrate; forming a pair of first word lines in the active region and a pair of second word lines on the element isolating insulation layer adjacent to the active region, the first word lines being arranged in rows with a spacing $\lambda_2$ therebetween and the second word lines being arranged in rows with a spacing $\lambda_1$ therebetween, wherein the spacing $\lambda_2$ is different from the spacing $\lambda_2$; forming spacers on the peripheries of the first and the second word lines; forming source and drain regions in the semiconductor substrate adjacent to the first word lines in the active region, the first word lines and the source and drain regions forming a pair of transfer gate transistors; forming conductive plugs connected to the source and drain regions in a self-aligned manner; forming a bit line insulation layer on the word lines; forming a bit line on the bit line insulation layer, the bit line being electrically connected to one of the conductive plugs connected to the source region between the first word lines; and forming a capacitor having an electrode electrically connected to one of the plugs connected to one of the drain regions formed in the active region between one of the first word lines and one of the second word lines.

In another aspect of the present invention, a method for fabricating a DRAM includes the steps of: forming an active region surrounded with a field oxide layer in a semiconductor substrate; forming a pair of first word lines in the active region and a pair of second word lines on the field oxide layer adjacent to the active region, the first word lines being arranged in rows with a spacing $\lambda_2$ therebetween, the second word lines being arranged in rows with a spacing $\lambda_1$ therebetween, the first word lines being formed of a composite structure of polycrystalline silicon and transition metal, and the spacing $\lambda_2$ being greater than the spacing $\lambda_1$; forming spacers on the peripheries of the first and the second word lines, the spacers being formed of oxide; filling the spacing $\lambda_1$ between the second word lines with the spacers; forming source and drain regions in the semiconductor substrate adjacent to the first word lines in the active region; forming conductive plugs electrically connected to the source and drain regions in a self-aligned manner, the conductive plugs being formed of doped polycrystalline silicon; forming a bit line insulation layer; forming a bit line arranged in columns on the bit line insulation layer, the bit line being formed of tungsten and electrically connected to one of the plugs formed on the source region between the first word lines; and forming a capacitor having an electrode electrically connected to one of the plugs connected to one of the drain regions formed in the active region between one of the first word lines and one of the second word lines.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings:

FIGS. 2A to 2L are sectional views taken along a line I–I' in FIG. 1 showing the manufacturing steps of the DRAM according to the related art;

FIG. 3 is a plan view of a memory cell array of a DRAM according to the present invention; and FIGS. 4A to 4L are sectional views taken along a line II–II' in FIG. 3 showing the manufacturing steps of the DRAM according to the present invention.

DETAILED DESCRIPTION OF PREFERRED EMBODIMENT

Figure 1:
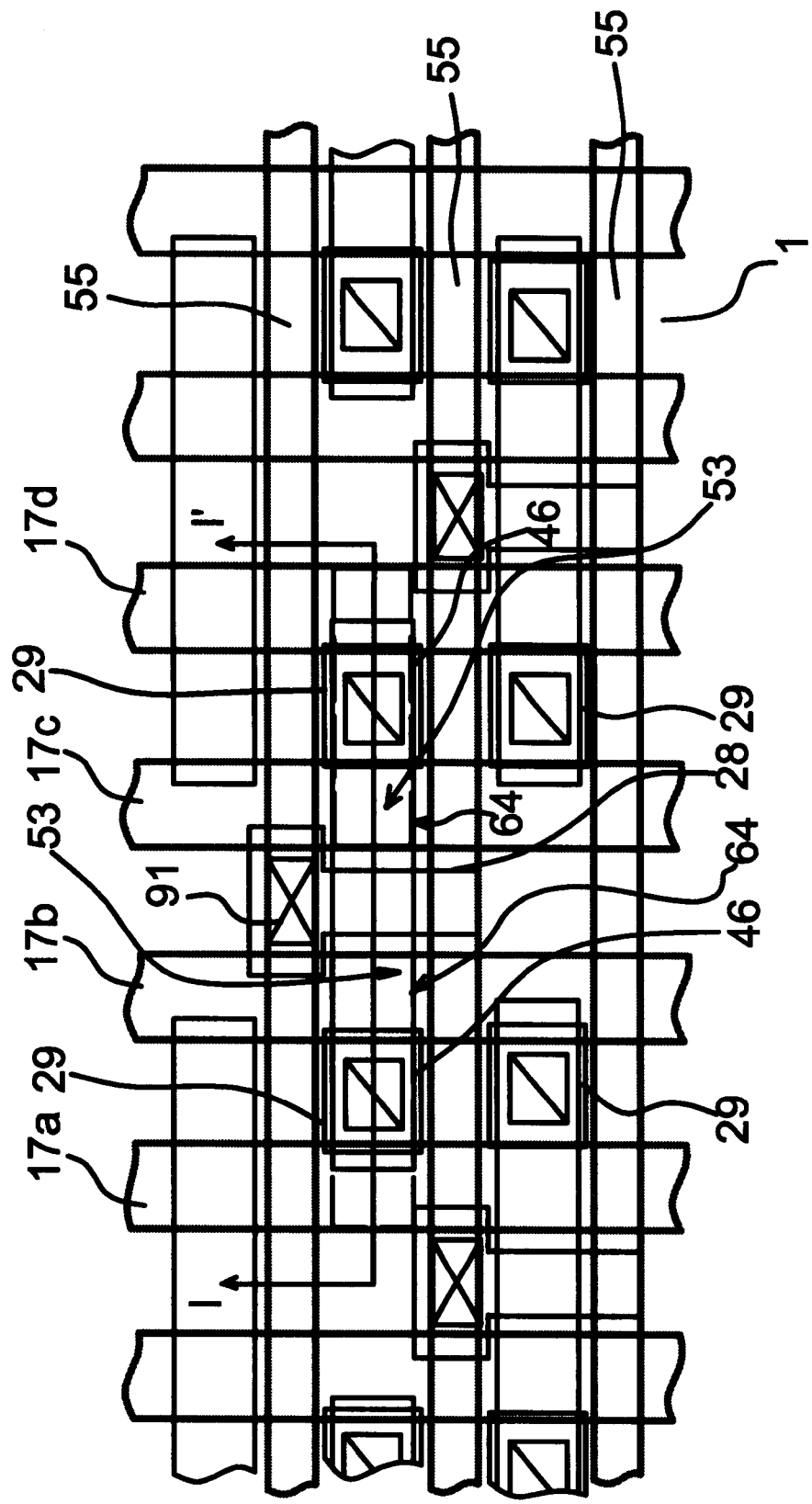
FIG. 1 is a plan view of a memory cell array of a DRAM according to a related art.
Figure 2A:
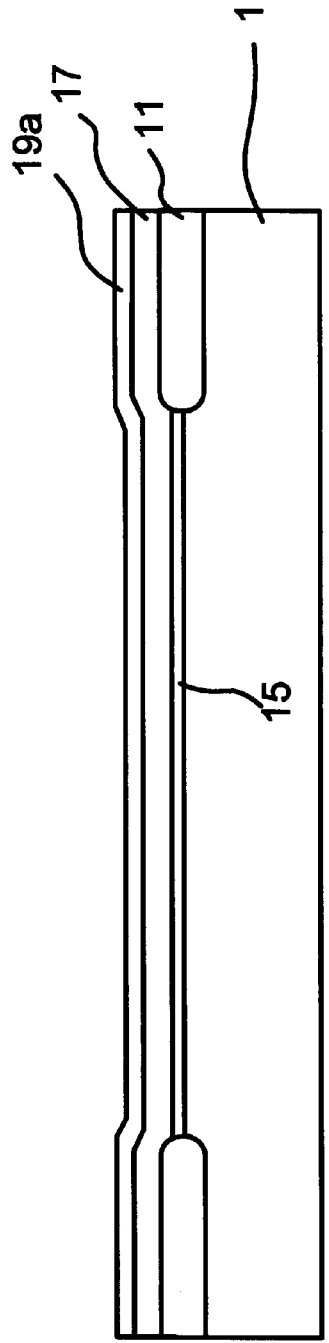
Figure 2B:
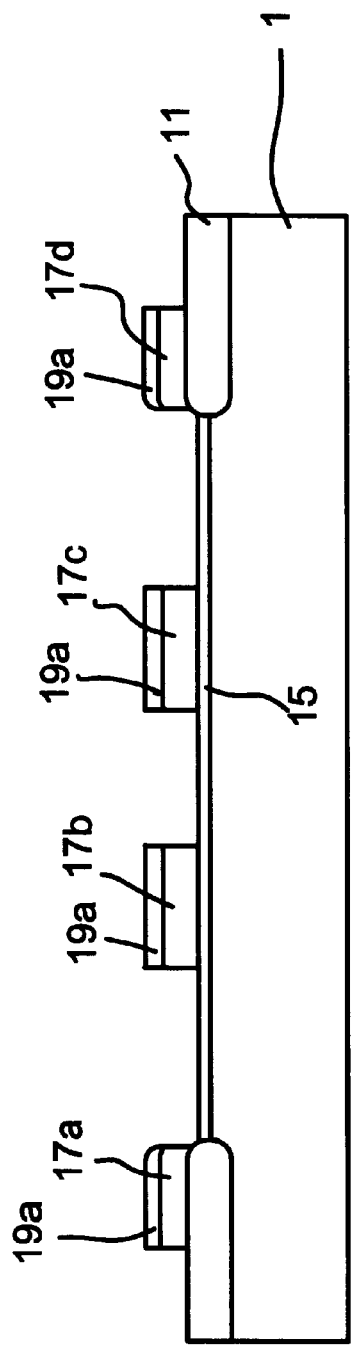
Figure 2E:
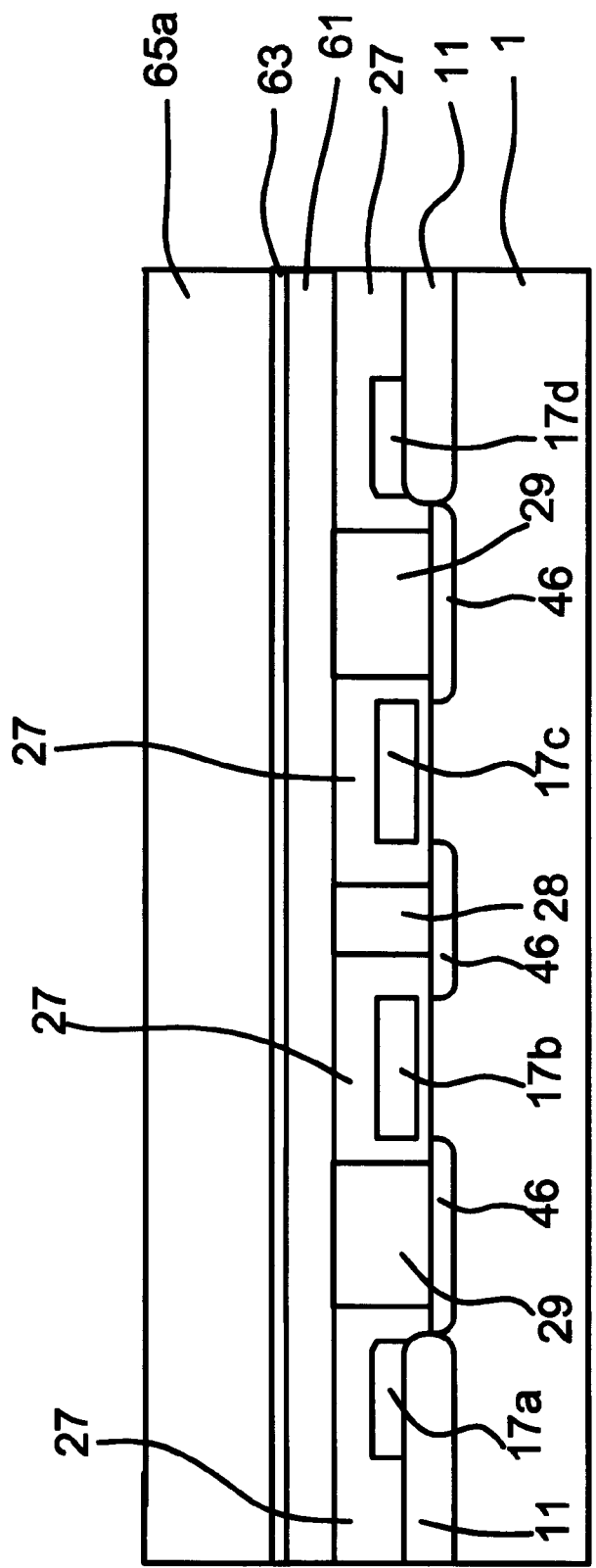
Figure 2F:
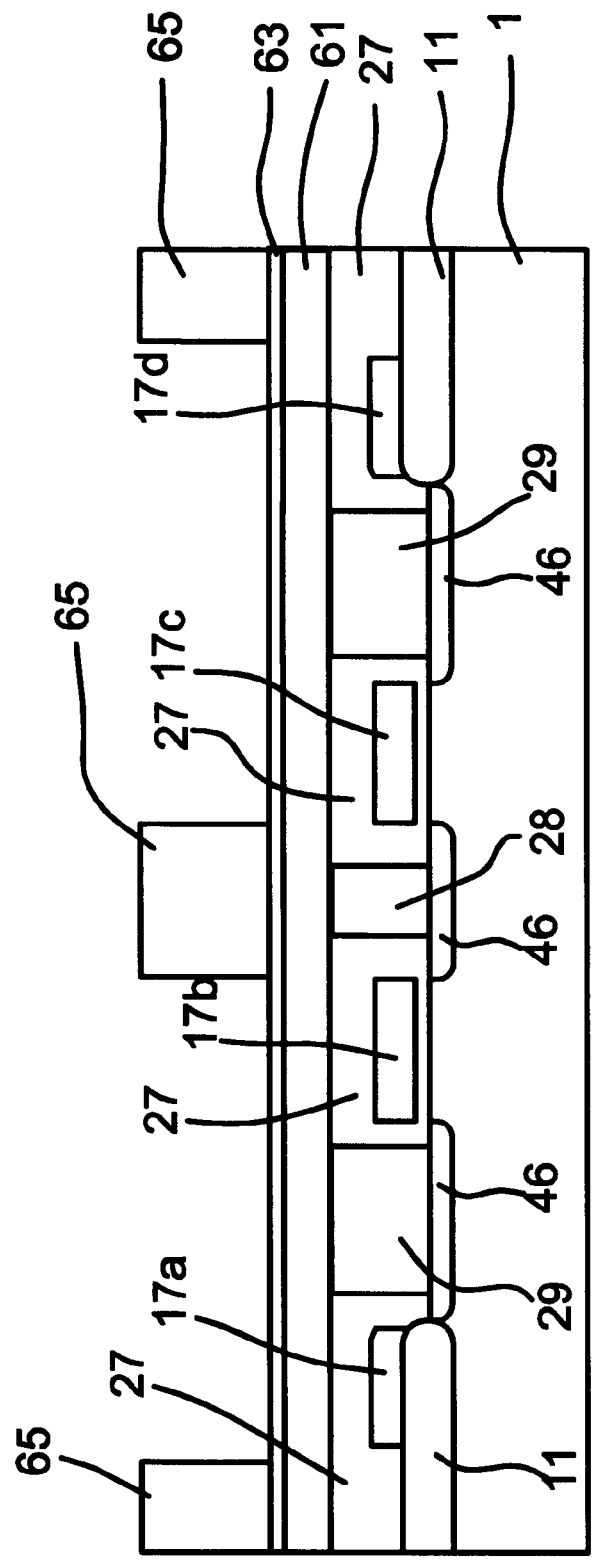
Figure 2G:
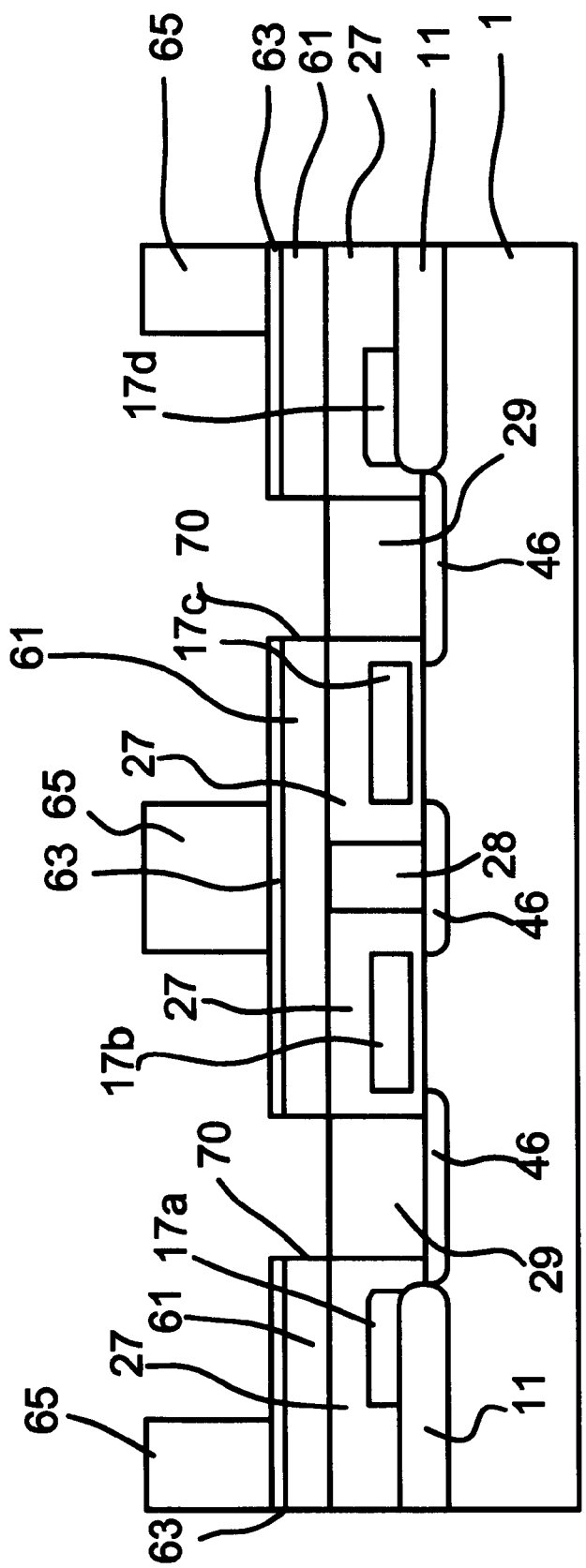
Figure 2H:
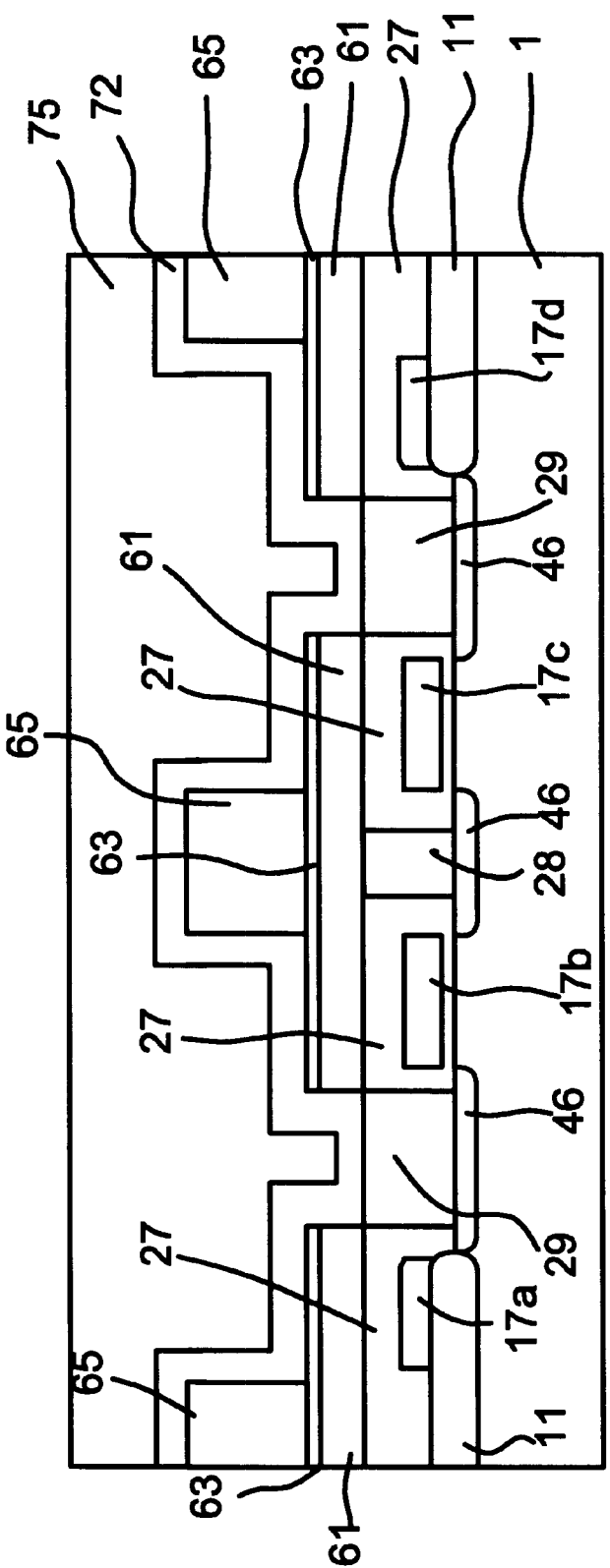
Figure 2I:
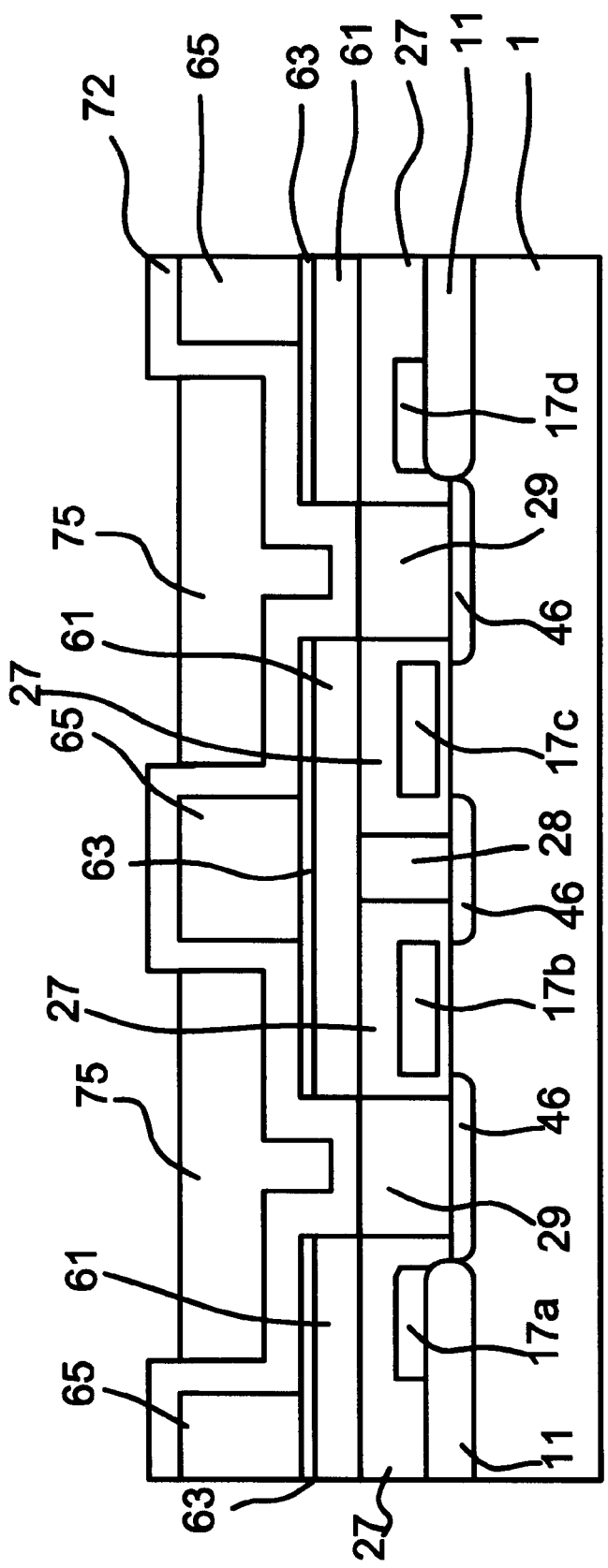
Figure 2J:
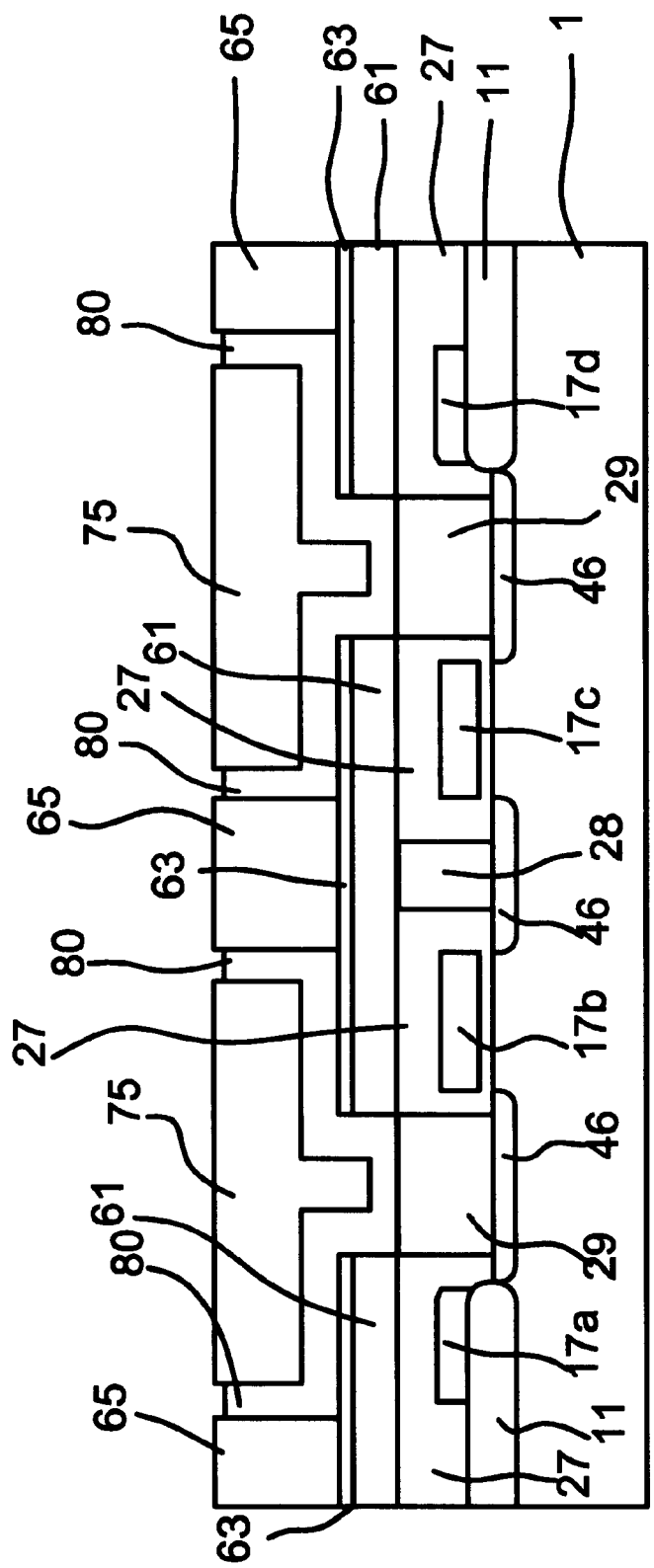
Figure 2K:
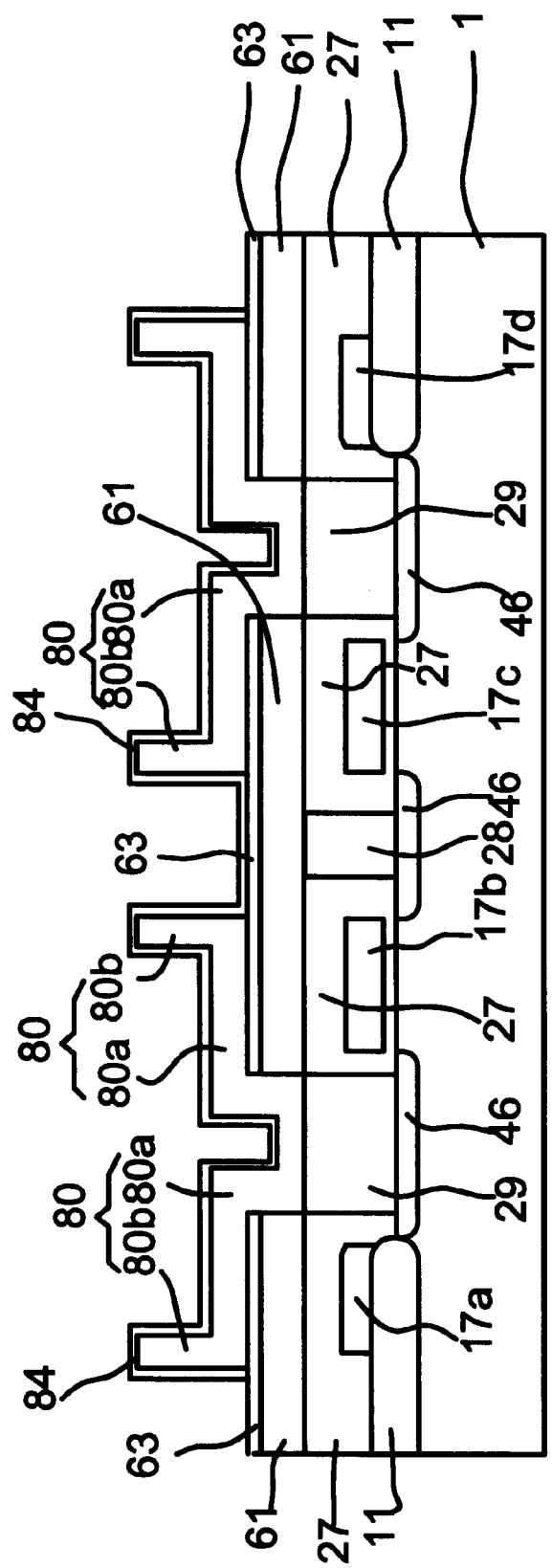
Figure 2L:
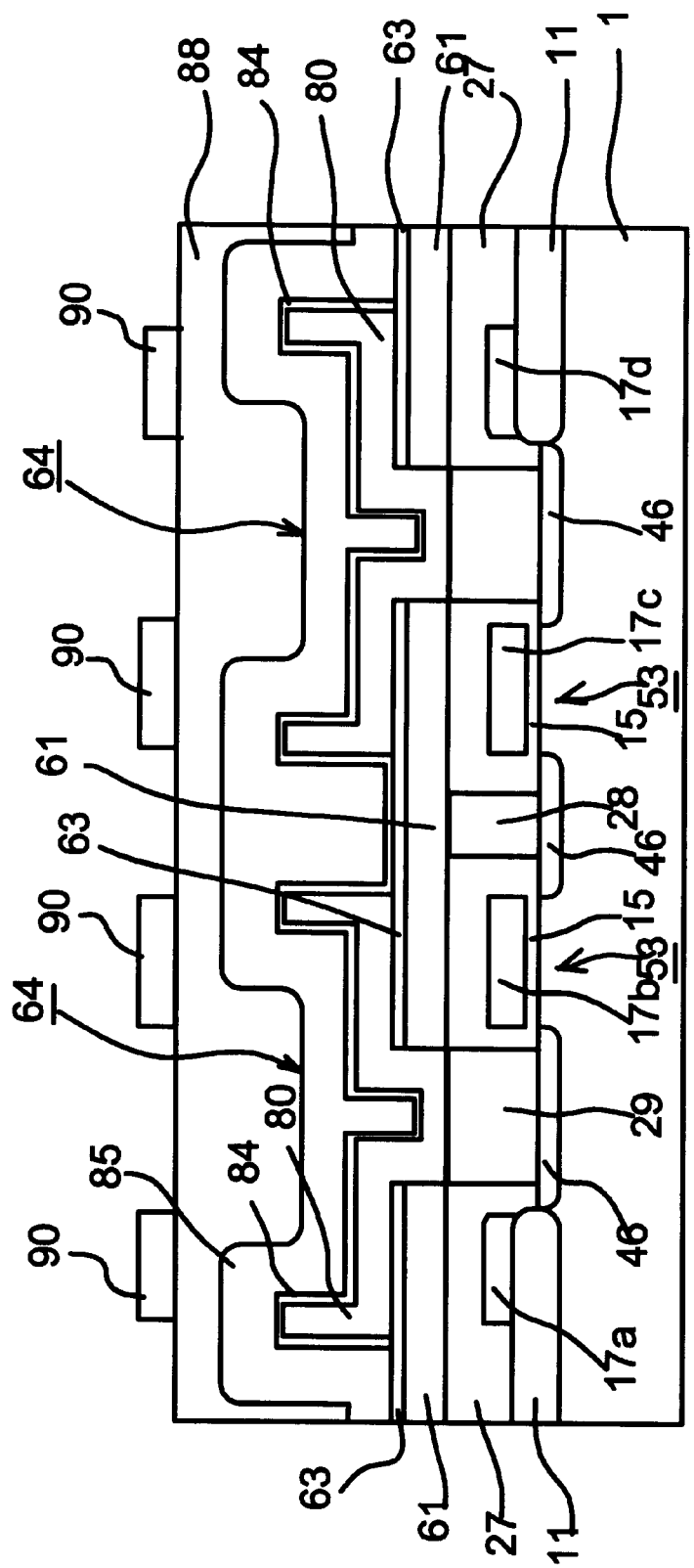

Reference will now be made in detail to the preferred embodiments of the present invention, examples of which are illustrated in the accompanying drawings.

FIG. 3 is a plan view of a memory cell array of a DRAM according to the present invention. As shown in FIG. 3, a plurality of word lines 117a, 117b, 117c, 117d and 117e, which run parallel with one another in rows, are formed on the surface of a semiconductor substrate 101. Also, a plurality of bit lines 155, which run parallel with one another in columns, are formed on the substrate 101. Also, a plurality of bit lines 155, which run parallel with one another in column, are formed on the substrate 101. A plurality of memory cells (MC) are arranged at the respective intersections of the word lines and the bit lines. Each memory cell comprises one transfer gate transistor 153 and one capacitor 164. The transfer gate transistor 153 comprises a pair of source/drain regions 146 formed in the surface of the semiconductor substrate 101 and a gate electrode (word line) 117b or 117c formed between the source/drain region 146.

The word lines 117b and 117c overlying the element isolating insulation layer have a spacing $\lambda_1$ therebetween, which is about twice the width ω of a sidewall spacer 120 (not shown) of the gate electrodes 117b and 117c. The spacing $\lambda_2$ between word lines interposed between the source and drain regions is greater than the spacing $\lambda_1$ between the word lines overlying the element isolating insulation layer.

When an insulation layer deposited on the whole surface of the substrate 101 is etched by an anisotropic RIE method to form the sidewall spacers 120 on the peripheries of the word lines, the sidewall spacer 120 gap-fills the $\lambda_1$ spacing region of the word lines overlying the element isolating insulation layer, while in the $\lambda_2$ spacing region of the word lines between the source and drain regions 146, the spacers 120 are formed on the peripheries of the word lines which constitute the transfer gate transistor to sufficiently expose the source and drain regions 146.

A conductive layer such as a doped polycrystalline silicon layer is deposited on the whole surface of the semiconductor substrate 101 and then subjected to an RIE etch back process to leave a plug in the $\lambda_2$ spacing region of the word lines between the source and drain regions 146. The plug is thus formed in a self-aligned manner without using lithography.

The reference numeral 191 denotes a bit line contact hole located over the element isolating insulation layer, and the reference numeral 170 denotes a capacitor contact hole located over the active region.

Now, manufacturing steps of the DRAM memory cell shown in FIG. 3 will be described with reference to the sectional views of FIGS. 4A to 4L, which are views along line II–II' of FIG. 3.

Figure 4A:
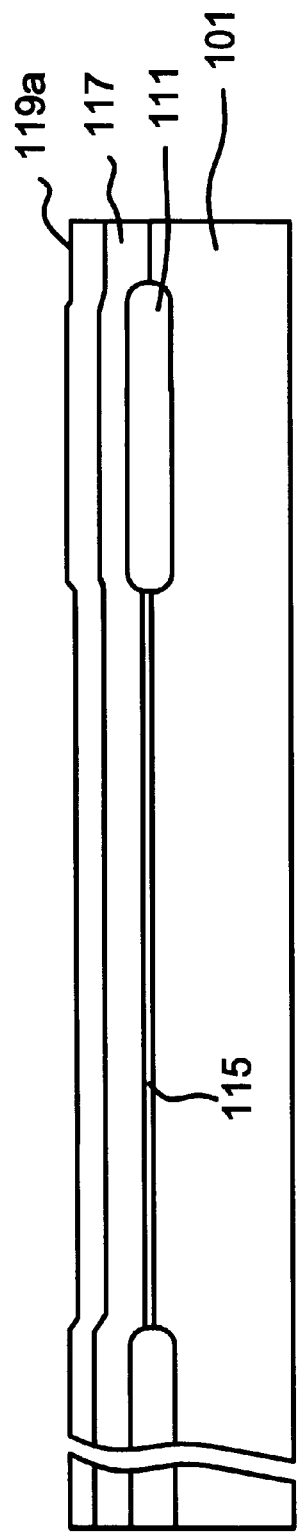

As shown in FIG. 4A, an element isolating insulation layer 111 and a channel stopper region (not shown) are formed in predetermined regions on the main surface of a P-type semiconductor substrate 101. A gate insulation layer 115, a polycrystalline silicon layer 117 and an interlayer insulation layer 119a are sequentially formed on the surface of the semiconductor substrate 101.

The element isolating insulation layer 111 may be formed by a selective oxidation method such as a LOCOS method or other methods, including STI. The gate insulation layer 115 of a silicon oxide film is formed by the thermal oxidation method. The layer 117 of a polycrystalline silicon film and a transition metal film such as tungsten, and the interlayer insulation layer 119a are each deposited to a thickness of about 1000–2000 Å, preferably about 1500 Å, by the CVD method. A gate electrode is made up of composite films 117 comprising a doped polycrystalline layer and a transition metal film such as tungsten. The interlayer insulation layer 119a is composed of an insulation layer such as a silicon oxide film or a silicon nitride film.

Figure 4B:
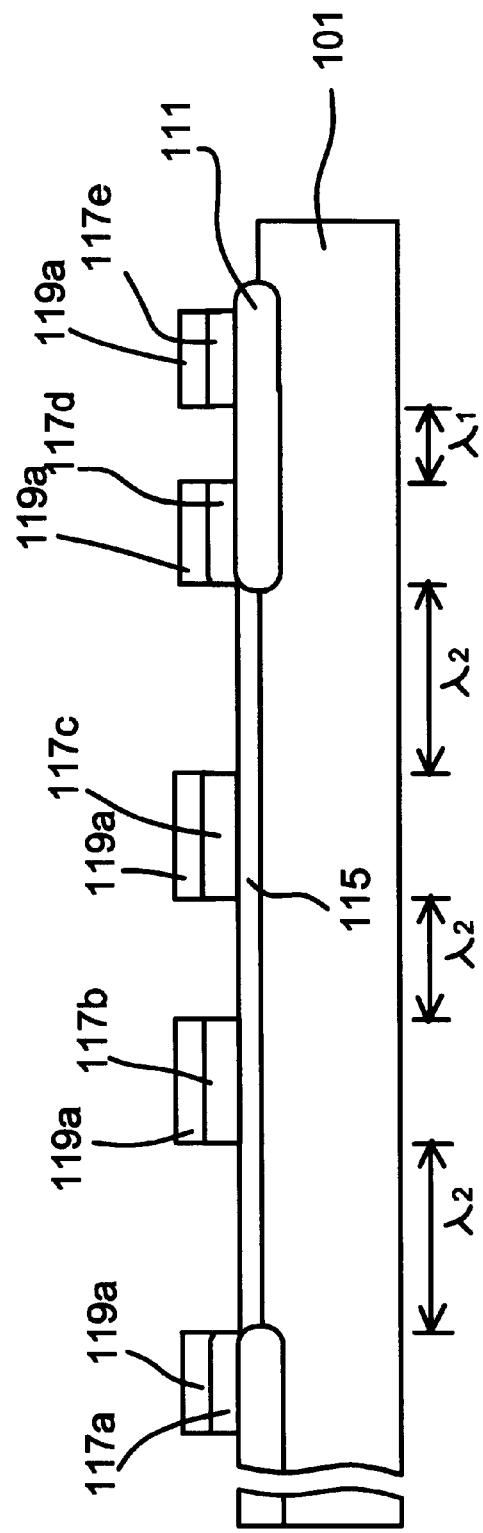

As shown in FIG. 4B, word lines 117a, 117b, 117c, 117d and 117e are formed by photolithography and the etching method. The interlayer insulation layer 119a of the patterned silicon oxide film or silicon nitride film is left on the surface of the word lines.

The word lines 117d and 117e are located on the element isolating insulation layer 111 and have a spacing $\lambda_1$ therebetween. The word lines 117b and 117c are located on the active region and have a spacing $\lambda_2$ therebetween. The spacing of the word lines 117a and 117b as well as that of the word lines 117c and 117d is $\lambda_2$.

Figure 4C:
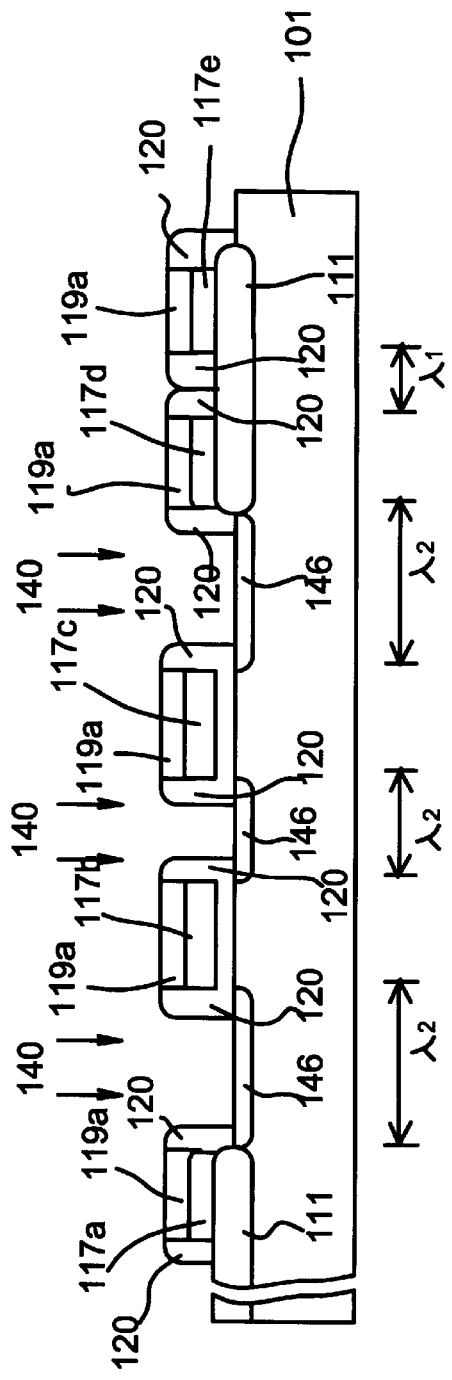

As shown in FIG. 4C, an insulation layer is deposited on the whole surface of the semiconductor substrate 101 by the CVD method and etched by an anisotropic RIE to form sidewall spacers 120 on the peripheries of the word lines 117a–117e. Impurity ions 140, e.g., arsenic, are implanted under an implantation energy 30 KeV at a dose of $4.0 \times 10^{15}/\text{cm}^2$ in the surface of the silicon substrate 101 by using the word lines 117a–117e covered with the insulation layer 119a and the spacers 120 as masks to form the source and drain regions 146 of the transfer gate transistor.

The spacers 120 are made of a silicon oxide film or silicon nitride film, or an insulation layer of polycrystalline silicon. The spacing between the word lines 117d and 117e is about $\lambda_1$, approximately twice as large as the width $\omega$ of the spacers 120, and is gap-filled with the spacers 120. In the $\lambda_2$ spacing region of the word lines located between the source and drain regions 146, the spacers 120 are formed on the peripheries of the word lines which constitute the transfer gate transistor, sufficiently exposing the semiconductor substrate 101 within the source and drain regions 146. The width $\omega$ of the spacers 120 is dependent upon the thickness of an insulation layer to be etched back to form the spacer and upon the height (thickness) of the gate electrode.

For example, the word lines 117d and 117e may be formed to a thickness of 1500 Å and to have a physical gate length of 0.2 μm (2000 Å). Also, for example, the interlayer insulation layer 119a may have a thickness of 1500 Å. If an insulation layer to be etched to form the spacers is deposited to a thickness of 700 Å and then blanket etched by the anisotropic RIE, the spacers 120 having a width of about 700 Å are formed on the peripheries of the word lines 117d and 117e. Then, the word lines 117d and 117e having a spacing $\lambda_1$ of, for example, 0.13 μm (1300 Å) therebetween would have the spacing completely filled with the spacers 120. The spacing $\lambda_2$ between the word lines 117b and 117c interposed between the source and drain regions 146 and 146 may be, for example, 0.2 μm (2000 Å) which is the physical gate length. In this example, the word lines 117d and 117e would be patterned to have a spacing of 0.13 μm (1300 Å) therebetween by lithography using a KrF excimer laser.

Figure 4D:
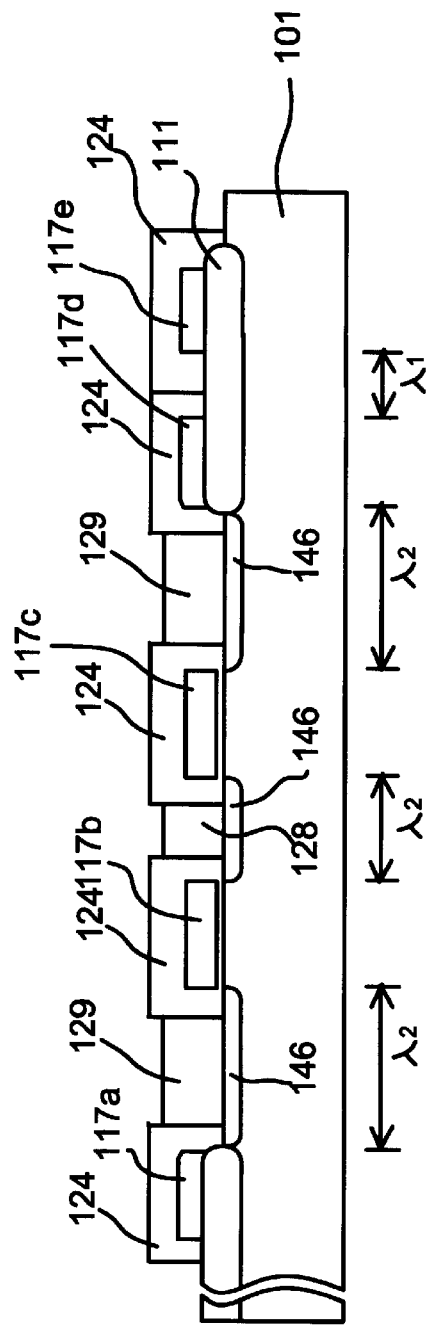

As shown in FIG. 4D, a conductive layer such as a doped polycrystalline silicon layer is deposited on the whole surface of the semiconductor substrate 101 and then subjected to the RIE etch back process to leave plugs 128 and 129 only in the $\lambda_2$ spacing region disposed between the word lines, e.g., the source and drain regions 146.

The interlayer insulation layer 119a on the word lines and the sidewall spacers 120 on the peripheries of the word lines are integrally called an interlayer insulation layer 124. The plugs 128 and 129 may be formed not only by the etch-back process using the RIE but also by other methods, including the CMP.

As shown in FIG. 4E, an insulation layer 161 is deposited on the whole surface of the semiconductor substrate 101 to insulate the plugs 128 and 129. Contact holes (not shown) are formed on a bit line contact plug by photolithography and the etching method. A doped polysilicon layer, a metal layer, a metal silicide layer, or another conductive layer, such as tungsten or the like, is deposited on the surface of the semiconductor substrate 101 by the CVD method or the sputtering method and then patterned by photolithography and the etching method to form bit lines (not shown). Subsequently, an etching stopping layer 163, such as a nitride ($Si_3N_4$) film having a thickness of more than 100 Å, is formed on the interlayer insulation layer 161. Then, a silicon oxide ($SiO_2$) film 165a having a thickness of more than 5000 Å is formed on the surface of the nitride film 163.

The bit lines are disposed above the element isolating insulation layer of the memory cell array and in the direction perpendicular to the word lines. The bit lines are also arranged in parallel with the active regions of the memory cell array, each having two transfer gate transistors as a MOS transistor.

Figure 4F:
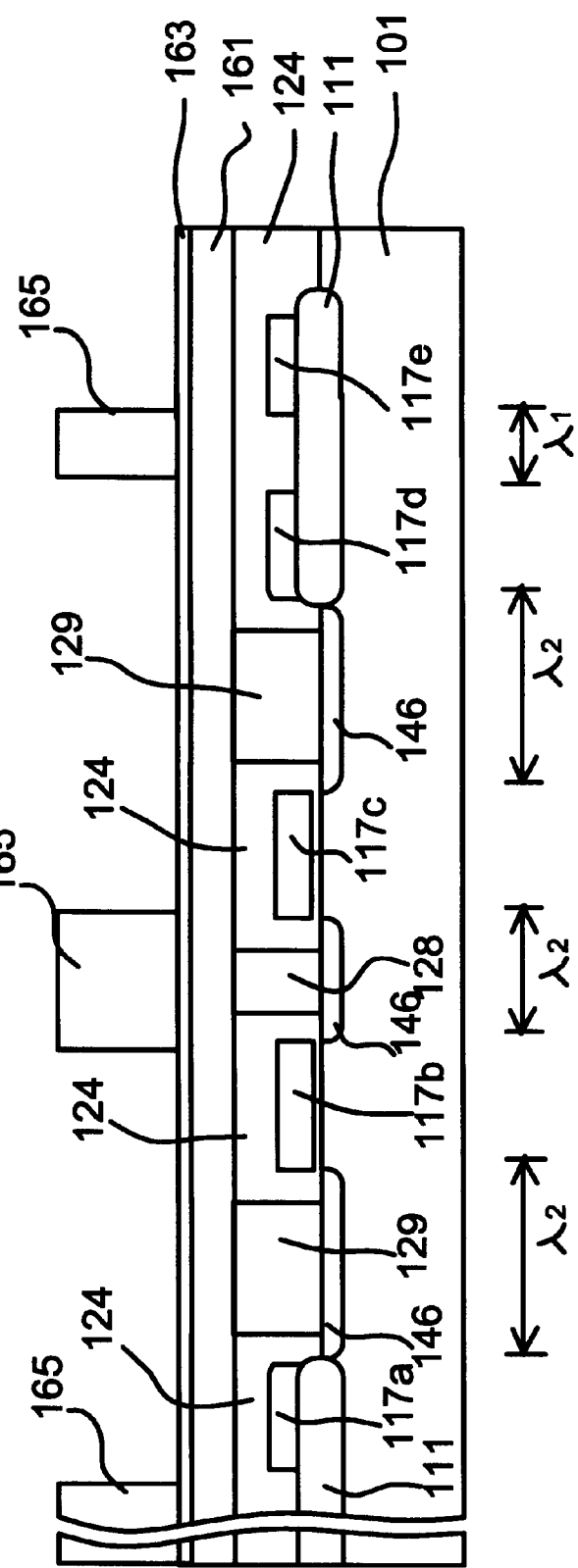

As shown in FIG. 4F, a capacitor isolating layer 165 for isolating the adjacent capacitors is formed by patterning the oxide film 165a by the etching method. The selective ratio of the etching of the nitride film 163 which is an etching stopping layer to the oxide film 165a is extremely high. Therefore, in this etching step, the nitride film 163 is etched at a much slower rate than the oxide film 165a.

Figure 4G:
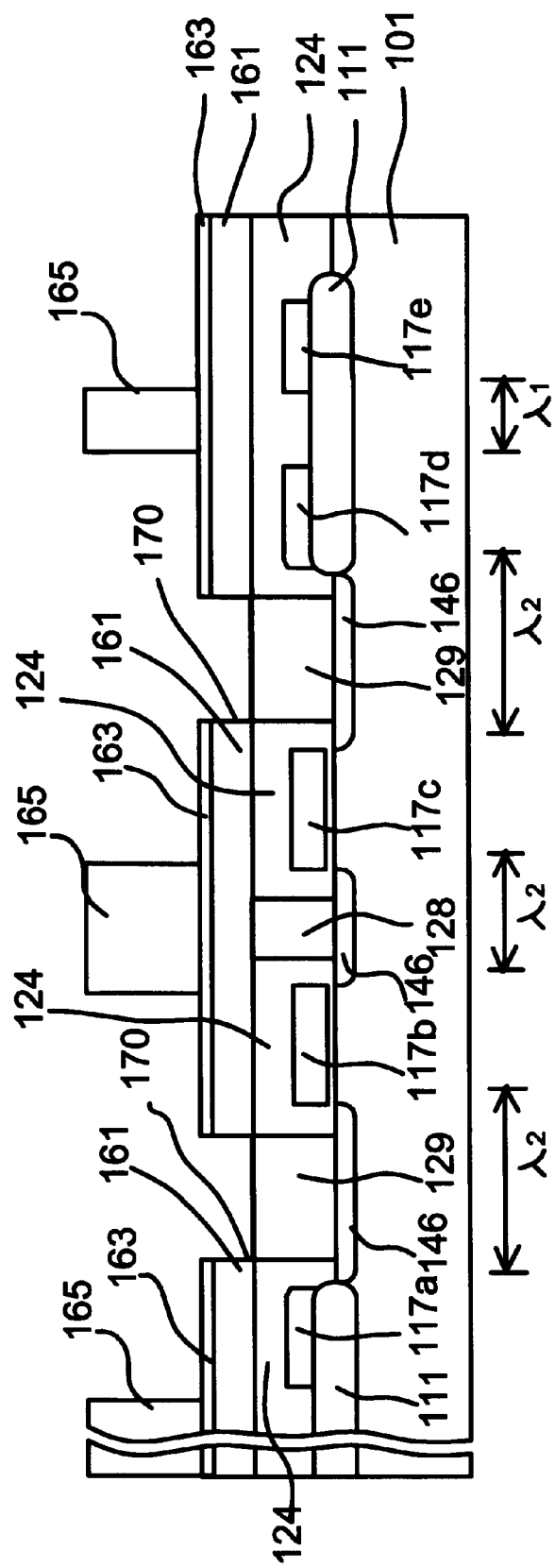

As shown in FIG. 4G, contact holes 170 are formed so as to reach the plug of the capacitor node contact portion 129 on the source and drain regions 146 by photolithography and the etching method.

Figure 4H:
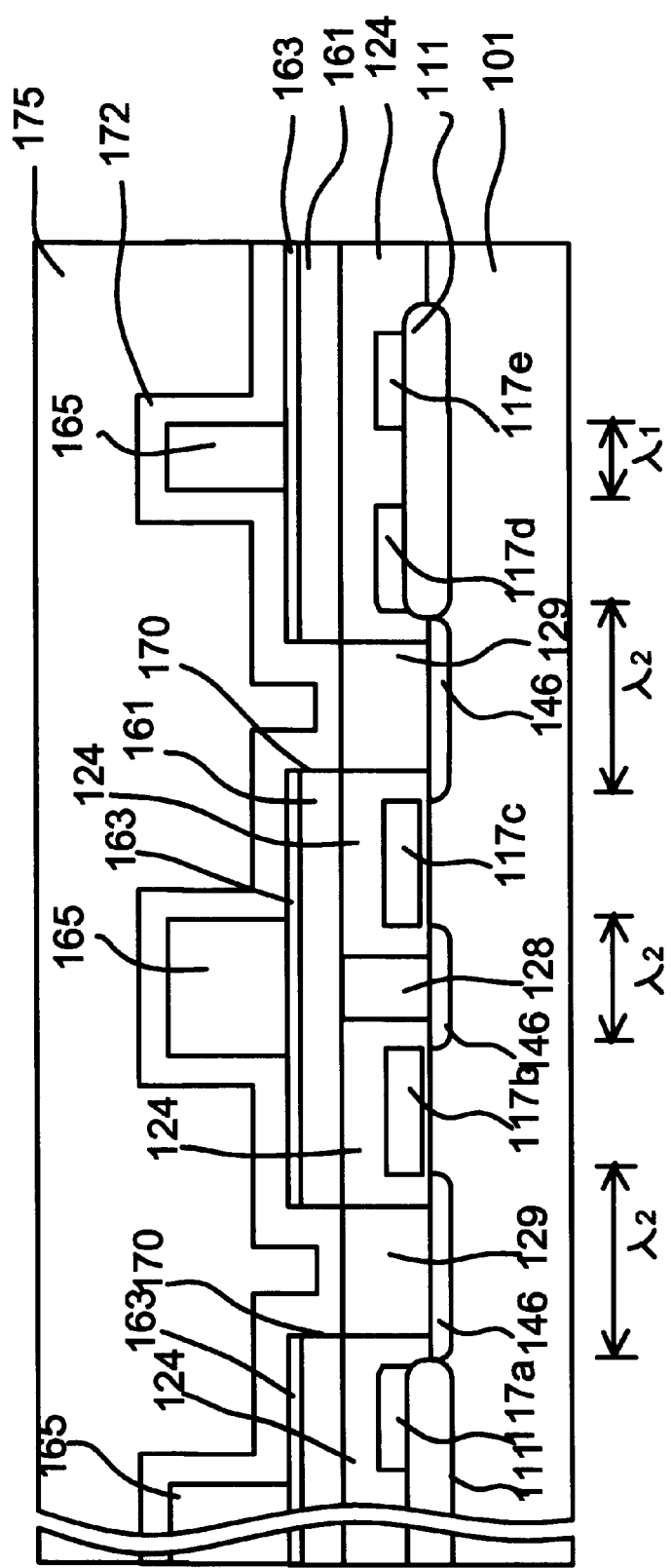

As shown in FIG. 4H, a polycrystalline silicon layer 172 having a thickness of about 500–1500 Å, preferably about 1000 Å, is deposited on an inner surface of the contact hole 170, on the surface of the nitride film 163, and on the surface of the capacitor isolating layer 165 by the CVD method. Then, a thick resist 175 is applied over a surface of the polycrystalline silicon layer 172.

Figure 4I:
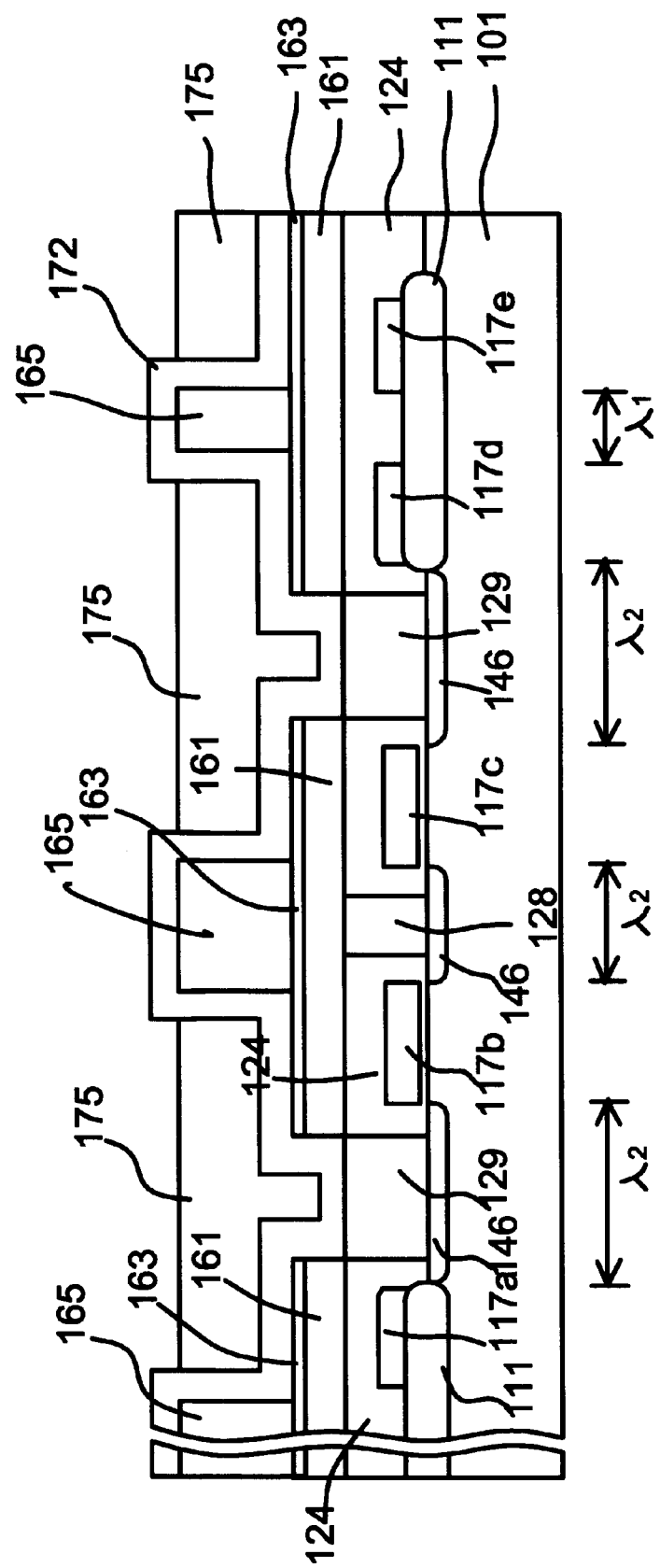

As shown in FIG. 4I, the resist 175 is etched back to expose a part of the polycrystalline silicon layer 172.

As shown in FIG. 4J, the exposed surface of the polycrystalline silicon layer 172 is selectively removed by anisotropic etch or the like. As a result, the polycrystalline silicon layer 172 is isolated on the surface of the capacitor isolating layer 165 to form a lower electrode 180 of the capacitor.

Figure 4K:
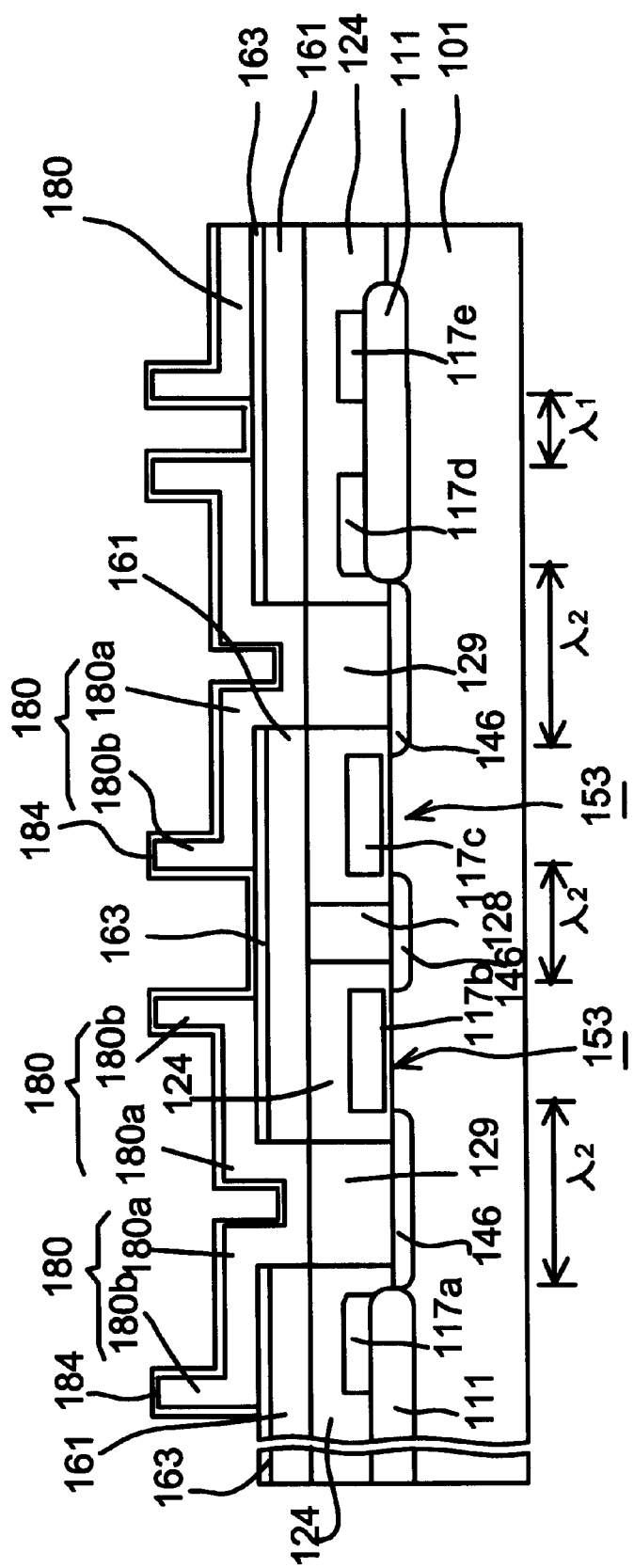

As shown in FIG. 4K, the resist 175 is removed by the etching method, and the capacitor isolating layer 165 is removed by the plasma etching method. Then, a dielectric layer 184, such as a nitride film, is formed on the surface of the lower electrode 180. The lower electrode 180 of the capacitor may have a cylindrical shape or any other shape formed by known manufacturing methods. The dielectric layer 184 formed on the surface of the lower electrode 180 is a silicon nitride ($Si_3N_4$) film or silicon oxide ($SiO_2$) film, or a composite film of silicon nitride and silicon oxide, or tantalum oxide ($Ta_2O_5$) or hafnium oxide ($HaO_2$).

Figure 4L:
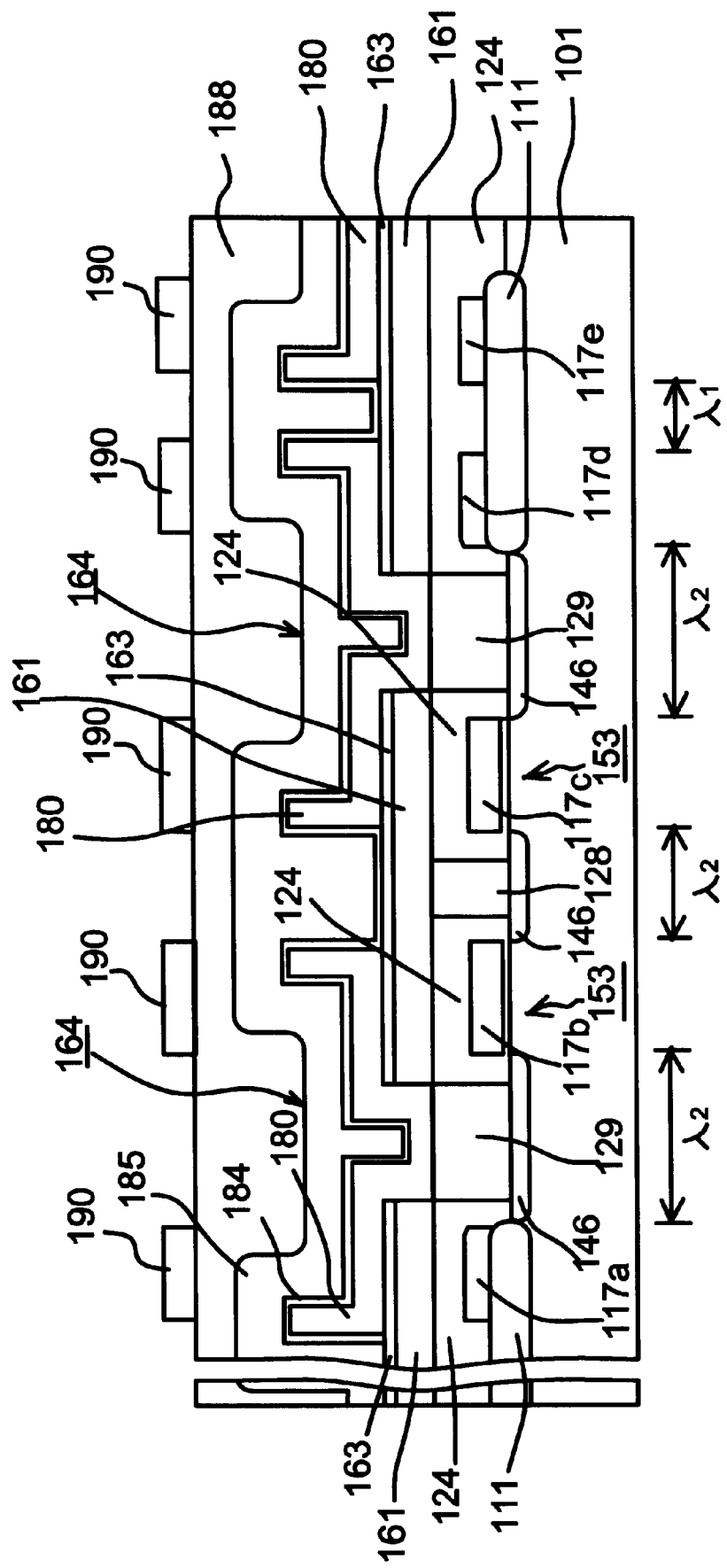

As shown in FIG. 4L, an upper electrode 185 is formed of a polycrystalline silicon layer having a thickness of about 2000–3000 Å, preferably about 2500 Å, on the surface of the dielectric layer 184 by the CVD method. Then, an insulation layer 188 and an interconnection layer 190 are formed to complete the manufacturing steps of the memory cell of the DRAM.

As described above, the present invention makes it possible to increase the dimensional allowance and enhance the degree of integration of the memory cell in the DRAM, by patterning the plugs, which are used as the bit line and capacitor contacts in the source and drain regions 146 disposed on both sides of the word lines 117b and 117c, in a self-aligned manner.

It will be apparent to those skilled in the art that various modifications and variations can be made in the present invention without departing from the spirit or scope of the invention. Thus, it is intended that the present invention cover the modifications and variations of this invention provided they come within the scope of the appended claims and their equivalents.

What is claimed is:

1. A method for fabricating a DRAM, comprising the steps of:
   forming an active region and an insulating region in a semiconductor substrate;
   forming a pair of word lines arranged in rows adjacent to each other in the active region and the insulating region, said word lines having a spacing $\lambda_2$ therebetween in the active region and a spacing $\lambda_1$ therebetween in the insulating region, wherein said spacing $\lambda_1$ is different from said spacing $\lambda_2$;
   forming spacers on the peripheries of said word lines;
   forming source and drain regions in said semiconductor substrate adjacent to said word lines in said active region, said word lines in said active region and said source and drain regions forming a pair of transfer gate transistors;
   forming conductive plugs connected to said source and drain regions in a self-aligned manner;
   forming a bit line insulation layer on said pair of word lines;
   forming a bit line on said bit line insulation layer, said bit line being electrically connected to one of said conductive plugs connected to said source region between said pair of word lines in the active region; and
   forming a capacitor having an electrode electrically connected to one of said plugs connected to one of said drain regions formed in said active region between one of said word lines in the active region and one of said word lines in said insulating region.

2. The method of claim 1, wherein said word lines are formed of one of doped polycrystalline silicon and a composite of a transition metal and polycrystalline silicon.

3. The method of claim 1, wherein said spacers are formed of one of silicon oxide, silicon nitride, and undoped polycrystalline silicon.

4. The method of claim 1, wherein said spacing $\lambda_2$ is substantially larger than said spacing $\lambda_1$.

5. The method of claim 1, wherein a width $\omega$ of one of said spacers is greater than or equal to one half of said spacing $\lambda_1$, said spacing $\lambda_1$ being completely filled with said spacers.

6. A method for fabricating a DRAM, comprising the steps of:
   forming an active region and an insulating region in a semiconductor substrate;
   forming a pair of word lines in said active region and in said insulating region, said word lines being arranged adjacent to each other in rows with a spacing $\lambda_2$ therebetween in said active region and with a spacing $\lambda_1$ therebetween in said insulating region, said word lines in said active region being formed of a composite structure of polycrystalline silicon and transition metal, and said spacing $\lambda_2$ being greater than said spacing $\lambda_1$;
   forming spacers on the peripheries of said word lines, said spacers being formed of oxide;
   filling said spacing $\lambda_1$ between said word lines in said insulating region with said spacers;
   forming source and drain regions in said semiconductor substrate adjacent to said word lines in said active region;
   forming conductive plugs electrically connected to said source and drain regions in a self-aligned manner, said conductive plugs being formed of doped polycrystalline silicon;
   forming a bit line insulation layer;
   forming a bit line arranged in columns on said bit line insulation layer, said bit line being formed of tungsten and electrically connected to one of said plugs formed on said source region between said word lines formed in said active region; and
   forming a capacitor having an electrode electrically connected to one of said plugs connected to one of said drain regions formed in said active region between one of said word lines in the active region and one of said word lines in said insulating region.

* * * * *